United States Patent
Gopala Reddy Sunanda et al.

(10) Patent No.: US 10,370,939 B2
(45) Date of Patent: Aug. 6, 2019

(54) EFFICIENT WAY OF REPORTING ISSUES ASSOCIATED WITH RESERVOIR OPERATIONS TO SUPPORT TEAM

(71) Applicant: Halliburton Energy Services, Inc., Houston, TX (US)

(72) Inventors: Kiran Gopala Reddy Sunanda, Kingwood, TX (US); Ben Musgrave, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 275 days.

(21) Appl. No.: 15/322,400

(22) PCT Filed: Jul. 29, 2014

(86) PCT No.: PCT/US2014/048622
§ 371 (c)(1),
(2) Date: Dec. 27, 2016

(87) PCT Pub. No.: WO2016/018252
PCT Pub. Date: Feb. 4, 2016

(65) Prior Publication Data
US 2017/0138155 A1    May 18, 2017

(51) Int. Cl.
*E21B 41/00* (2006.01)
*G06F 16/22* (2019.01)
*G06F 17/50* (2006.01)
*G01V 11/00* (2006.01)

(52) U.S. Cl.
CPC .......... *E21B 41/00* (2013.01); *G01V 11/002* (2013.01); *G06F 16/22* (2019.01); *G06F 17/50* (2013.01)

(58) Field of Classification Search
CPC . E21B 41/00; G01V 11/002; G06F 17/30312; G06F 17/50
See application file for complete search history.

(56) References Cited

U.S. PATENT DOCUMENTS

| | | |
|---|---|---|
| 5,202,726 A | 4/1993 | McCulley et al. |
| 6,967,589 B1 | 11/2005 | Peters |
| 8,234,238 B2 | 7/2012 | Keith, Jr. |
| 8,595,453 B2 | 11/2013 | Iwamura et al. |

(Continued)

FOREIGN PATENT DOCUMENTS

| | | |
|---|---|---|
| EP | 2548660 A2 | 1/2013 |
| WO | 2001/098631 A1 | 12/2001 |
| WO | 2008/017895 A1 | 2/2008 |

OTHER PUBLICATIONS

International Search Report and Written Opinion issued in related PCT Application No. PCT/US2014/048622 dated May 26, 2015, 12 pages.

(Continued)

*Primary Examiner* — Brad Harcourt
(74) *Attorney, Agent, or Firm* — Jason Sedano; Baker Botts L.L.P.

(57) ABSTRACT

In some aspects, the present invention comprises a system and method for optimizing by automation the reporting and potential resolution of issues that may arise at a reservoir operation. Such issues typically require manual communication and collection, but with the present invention, the reporting and resolving of such issues can be automated using software that will reduce the non-productive time associated with reservoir operations.

20 Claims, 3 Drawing Sheets

(56) References Cited

U.S. PATENT DOCUMENTS

2009/0277644 A1 11/2009 McStay et al.
2013/0076525 A1 3/2013 Vu et al.
2013/0080062 A1 3/2013 Aamodt et al.

OTHER PUBLICATIONS

Menon, Ashe. "Messages from the machine: Maintenance process goes smart." Drilling contractor 69.5 (2013).
International Preliminary Report on Patentability issued in related Application No. PCT/US2014/048622, dated Feb. 9, 2017 (9 pages).

EFFICIENT WAY OF REPORTING ISSUES ASSOCIATED WITH RESERVOIR OPERATIONS TO SUPPORT TEAM

CROSS-REFERENCE TO RELATED APPLICATION

The present application is a U.S. National Stage Application of International Application No. PCT/US2014/048622 filed Jul. 29, 2014, which is incorporated herein by reference in its entirety for all purposes.

BACKGROUND

The present invention relates to a software control for improving methods and systems for reporting issues from reservoir operations, and in particular, optimizing and automating the process to reporting issues and providing resolution suggestions for issues from reservoir operation.

Monitoring and reporting of issues related to reservoir behavior due to injection and production processes is an important element in optimizing the performance and economics of completion and production operations. Examples of these processes may include hydraulic fracturing, water flooding, steam flooding, miscible flooding, wellbore workover operations, remedial treatments and many other hydrocarbon production activities, as well as drill cutting injection, $CO_2$ sequestration, produced water disposal, and various activities associated with hazardous waste injection. Because issues may arise in the reservoir that may be difficult to resolve and would require the technical support team to interfere with the identification and solution process, it may be desirable to identify a more optimized manner of reporting issues generated by sensor instruments at the reservoir or within the injection and production wells.

Because of the various complexities and processes involved with reservoir operation, there can be many issues that arise that may require a technical support team to resolve. Such issues require a technician on site at the reservoir to report such an issue by means of communication, including through electronic mail, telephone calls, and other means of communication. In particular, a technician at a particular reservoir operation may not be familiar with an issue generated at the reservoir, and thus may require a technical support team, or specialized support team, to understand and resolve the issue. Additionally, certain issues may require reporting to particular groups managing the reservoir operation for purposes of monitoring and maintaining a healthy and secure reservoir operation, and a technician must be familiar enough with the reporting process to properly identify the path for coming to a resolution and reporting of issues.

These issues may involve a wide range of reportable issues from a reservoir operation. Such issues may include errors with sensors that may be installed at the reservoir operation for measuring one or more characteristics of the reservoir. These issues may include, for example, issues associated with status of tools associated with reservoir operations. Such issues may require information to resolve the issue, which may be requested by the technical support team. Such information, which may include information required to debug and resolve the issue, could then be provided by means of the technician on site at the reservoir operation to the technical support team, which may be located at a remote or central site. Additionally, if information is missing, the technical support team may need to contact the technician on site at the reservoir operation for additional information related to the issue. Such communications may add delay and overhead as multiple iterations may be required to gather all of the information related to the issue needed to log and potentially resolve an issue at the reservoir operation. Certain of the issues may result in downtime at the reservoir operation. Due to the nature of reservoir operations, such as the need to rent equipment for processing a borehole at the reservoir operation, such delay may lead to increased costs and impact production at the reservoir.

Thus, there is a need for a software system without these limitations in communications that decrease the amount of delay between the reporting and resolving of issues associated with reservoir operations. The following description resolves these and other limitations by describing a software system for automatic identification and reporting of defects or malfunctioning issues in reservoir production.

Figure 1:
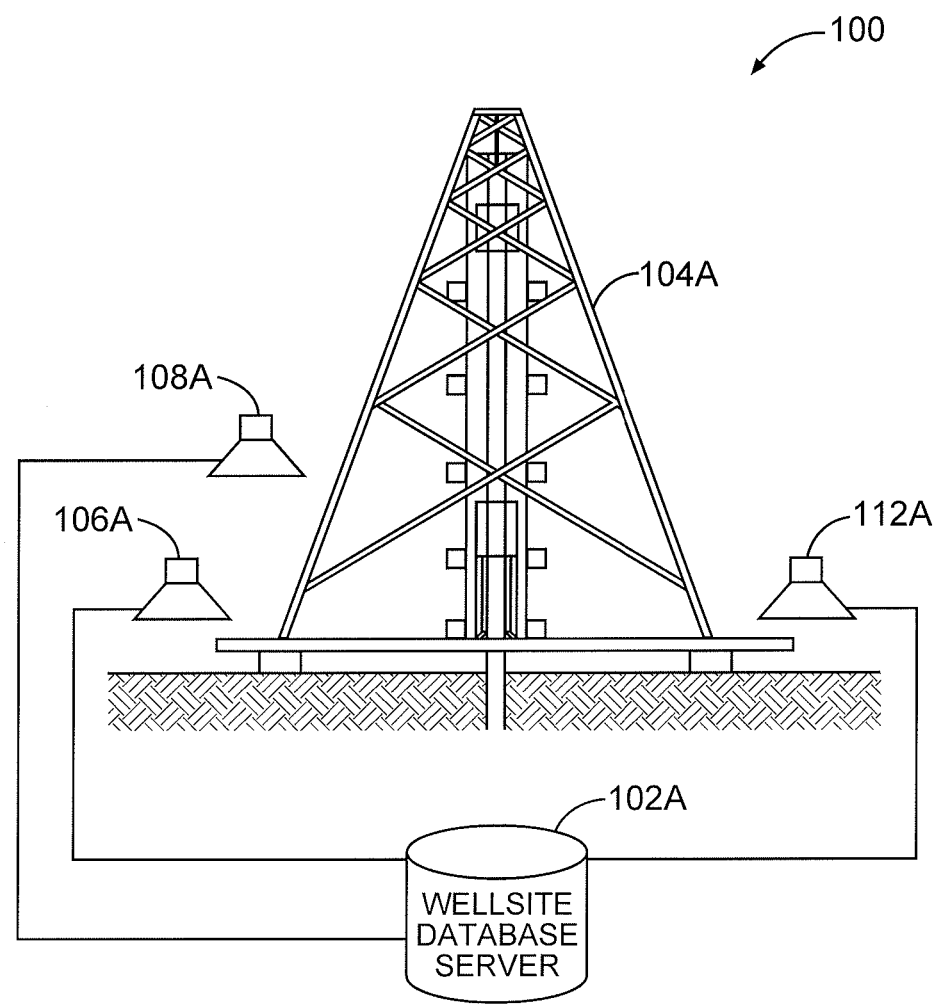
FIG. 1 is an illustrative wellsite system of the invention.

While embodiments of this disclosure have been depicted and described and are defined by reference to exemplary embodiments of the disclosure, such references do not imply a limitation on the disclosure, and no such limitation is to be inferred. The subject matter disclosed is capable of considerable modification, alteration, and equivalents in form and function, as will occur to those skilled in the pertinent art and having the benefit of this disclosure. The depicted and described embodiments of this disclosure are examples only, and not exhaustive of the scope of the disclosure.

DETAILED DESCRIPTION

For the purposes of this disclosure, computer-readable media may include any instrumentality or aggregation of instrumentalities that may retain data and/or instructions for a period of time. Computer-readable media may include, for example, without limitation, storage media such as a direct access storage device (e.g., a hard disk drive or floppy disk drive), a sequential access storage device (e.g., a tape disk drive), compact disk, CD-ROM, DVD, RAM, ROM, electrically erasable programmable read-only memory (EEPROM), and/or flash memory; as well as communications media such as wires, optical fibers, microwaves, radio waves, and other electromagnetic and/or optical carriers; and/or any combination of the foregoing.

Illustrative embodiments of the present invention are described in detail herein. In the interest of clarity, not all features of an actual implementation may be described in this specification. It will of course be appreciated that in the development of any such actual embodiment, numerous implementation-specific decisions may be made to achieve the specific implementation goals, which may vary from one implementation to another. Moreover, it will be appreciated that such a development effort might be complex and time-consuming, but would nevertheless be a routine undertaking for those of ordinary skill in the art having the benefit of the present disclosure.

To facilitate a better understanding of the present invention, the following examples of certain embodiments are given. In no way should the following examples be read to limit, or define, the scope of the invention. Embodiments of the present disclosure may be applicable to horizontal, vertical, deviated, or otherwise nonlinear wellbores in any type of subterranean formation. Embodiments may be applicable to injection wells as well as production wells, including hydrocarbon wells. Embodiments may be implemented using a tool that is made suitable for testing, retrieval and sampling along sections of the formation. Embodiments may be implemented with tools that, for example, may be conveyed through a flow passage in tubular string or using a wireline, slickline, coiled tubing, downhole robot or the like. Devices and methods in accordance with certain embodiments may be used in one or more of wireline, measurement-while-drilling (MWD) and logging-while-drilling (LWD) operations. "Measurement-while-drilling" is the term generally used for measuring conditions downhole concerning the movement and location of the drilling assembly while the drilling continues. "Logging-while-drilling" is the term generally used for similar techniques that concentrate more on formation parameter measurement.

The terms "couple" or "couples," as used herein are intended to mean either an indirect or direct connection. Thus, if a first device couples to a second device, that connection may be through a direct connection, or through an indirect electrical connection via other devices and connections. Similarly, the term "communicatively coupled" as used herein is intended to mean either a direct or an indirect communication connection. Such connection may be a wired or wireless connection such as, for example, Ethernet or LAN. Such wired and wireless connections are well known to those of ordinary skill in the art and will therefore not be discussed in detail herein. Thus, if a first device communicatively couples to a second device, that connection may be through a direct connection, or through an indirect communication connection via other devices and connections.

The present application is directed to using automation to optimize the reporting and resolution of issues that may arise at a reservoir location. The data necessary to resolve a particular issue may reside in several distinct computer monitoring stations. Typically, this data may need to be collected from each station, and that data may need to be communicated to a member of the technical support team that may need to then alert a specialist to interpret and provide a solution to such an issue. With the present application, automation may be used to collect, view, process, correlate, and store the data associated with a particular issue. In particular, software functions in accordance with the present invention can automate and optimize the process of gathering all of the relevant information associated with a reportable issue. The software can further contact the responsible contact person for the issue automatically to reduce the non-productive time involved with identifying the appropriate contact to report the issue.

In certain embodiments according to the present disclosure, automating the collection of data from various systems in a centralized database may involve a catalogue set up using unique identification codes for every identified issue concerning reservoir operation. The catalogue may include, for example, stored information associated with a unique identification code such as, for example, information needed to debug the issue, details regarding the issue, primary contact person for the issue, and possible troubleshooting steps for the issue. The software may further, based on the catalogue information associated with the unique identification code for the reportable issue, upload the necessary information for debugging the issue to a network storage location and create an access link for the location, such as to a file transfer protocol location. Once the necessary data has been uploaded to a network accessible location, the software may send a notification, such as by electronic mail, to a contact, such as the primary contact, for an issue with a link to the network accessible location. The software may further initiate a prompt on the monitoring station that may have reported the issue with possible steps to troubleshoot the issue.

These software functionalities may be introduced into existing reporting software for reservoir operations, thereby automating and optimizing the process and reducing the manpower and non-productive time associated reservoir operations related to such issues.

With reference to the attached figures, certain embodiments of the present invention include a system 100 that may include a wellsite 104A and a wellsite database server 102A that couples together information handling systems (IHS) 106A, 108A, and 112A that may collect, process, store, correlate, and display various wellsite data and real time operating parameters. The IHS 106A, 108A, and 112A for example, may receive wellsite data from various sensors at the wellsite, including downhole and surface sensors. Additional IHS may also be present (not picture) and the present invention is not intended to limit the number of IHS at a wellsite. The IHS may further function as monitoring stations for identifying reportable issues that may arise at the wellsite.

Figure 2:
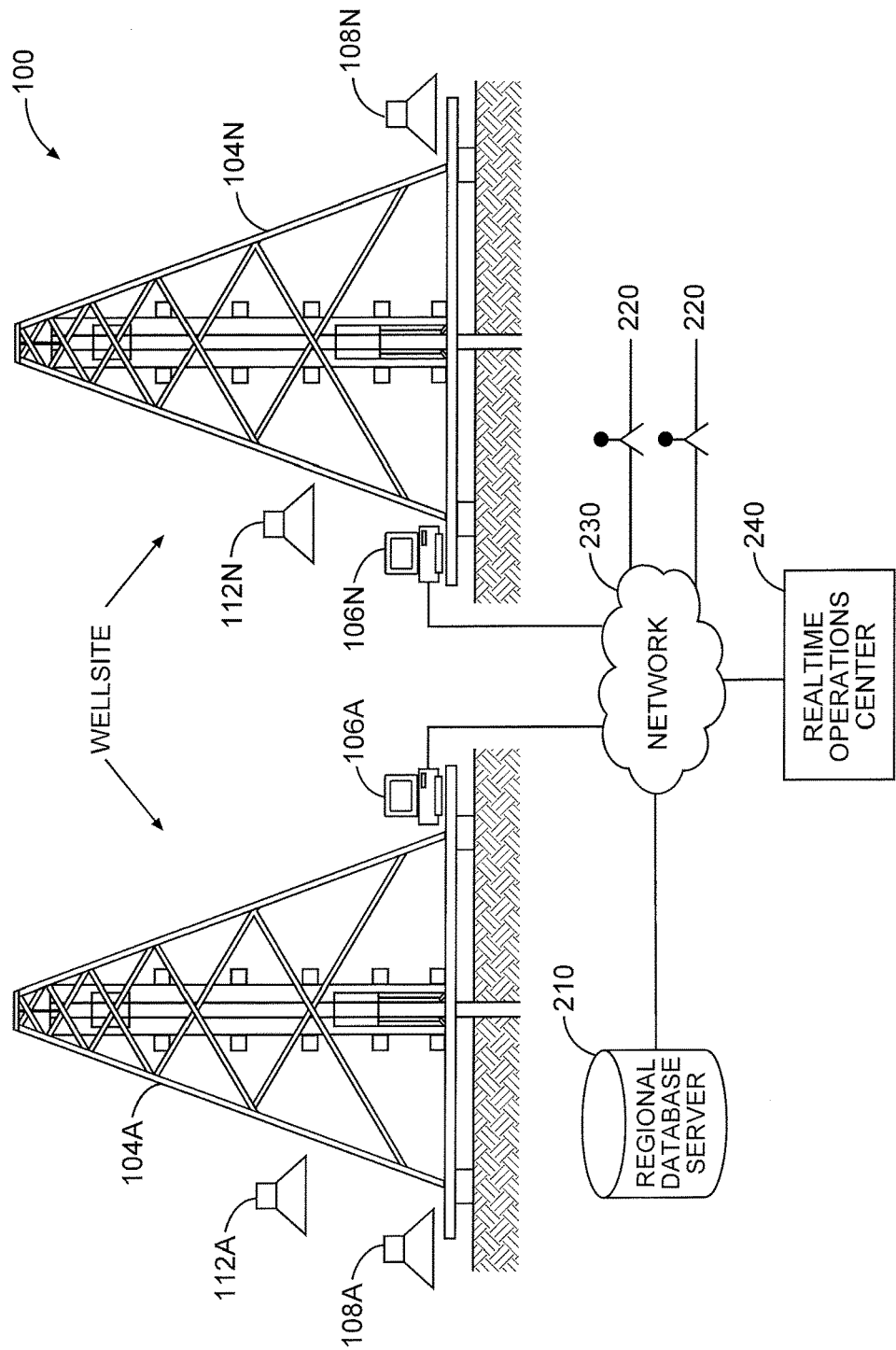
FIG. 2 shows another illustrative wellsite system of the invention.

FIG. 2 of the present invention includes a further description of the system 100 including a Network 230 that couples together at least one wellsite 104A-104N. Each wellsite may include the information handling systems 106A-N, 108A-N, and 112A-N. The Network 230 may be further coupled to a regional database server 210 that contains information associated with one or more of the wellsites 104A-104N. Moreover, the Network 230 may also be coupled to a Realtime Operations Center 240 for managing and monitoring the various wellsites 104A-104N.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components.

In an illustrative embodiment, the IHS may include an integrated control system for the wellsite data. The wellsite data may be replicated at one or more remote locations relative to the wellsite. The integrated control system may transmit data via network 230 and radio frequency transceivers 220 to remote locations.

The network communication may be any combination of wired and wireless communication. In one example, at least a portion of the communication is transferred across the internet using TCP/IP internet protocol. In some embodiments, the network communication may be based on one or more communication protocols (e.g., HyperText Transfer Protocol (HTTP), HTTP Secured (HTTPS), Application Data Interface (ADI), Well Information Transfer Standard Markup Language (WITSML), etc.). A particular non-volatile machine-readable medium 108 may store data from one or more wellsites and may be stored and retrieved based on various communication protocols. The non-volatile machine-readable media 108 may include disparate data sources (such as ADI, Javi Application Data Interface (JADI), Well Information Transfer Standard Markup Language (WITSML), Log ASCII Standard (LAS), Log Information Standard (LIS), Digital Log Interchange Standard (DLIS), Well Information Transfer Standard (WITS), American Standard Code for Information Interchange (ASCII), OpenWorks, SiesWorks, Petrel, Engineers Data Model (EDM), Real Time Data (RTD), Profibus, Modbus, OLE Process Control (OPC), various RF wireless communication protocols (such as Code Division Multiple Access (CDMA), Global System for Mobile Communications (GSM), etc.), Video/Audio, chat, etc.). While the system 100 shown in FIG. 1 employs a client-server architecture, embodiments are not limited to such an architecture, and could equally well find application in a distributed, or peer-to-peer, architecture system.

FIG. 2 illustrates an information handling system (IHS) 106A-106N, 108A-108N, 112A-112N that may be used for identifying wellsite issues, according to some embodiments. In the example shown, the IHS 106A-106N, 108A-108N, 112A-112N may include one or more processors. The IHS 106A-106N, 108A-108N, 112A-112N may include a memory unit, processor bus, and an input/output controller hub (ICH). The processor(s), memory unit, and ICH may be coupled to the processor bus. The processor(s, memory unit, and ICH may be coupled to the processor bus. The processor(s) may include any suitable processor architecture. IHS 106A-106N, 108A-108N, 112A-112N may include one or more processors, any of which may execute a set of instructions in accordance with embodiments of the invention.

The memory unit may store data and/or instructions, and may include any suitable memory, such as a dynamic random access memory (DRAM). IHS 106A-106N, 108A-108N, 112A-112N may also include hard drives such as IDE/ATA drive(s) and/or other suitable computer readable media storage and retrieval devices. A graphics controller may control the display of information on a display device, according to certain embodiments of the invention.

Figure 3:
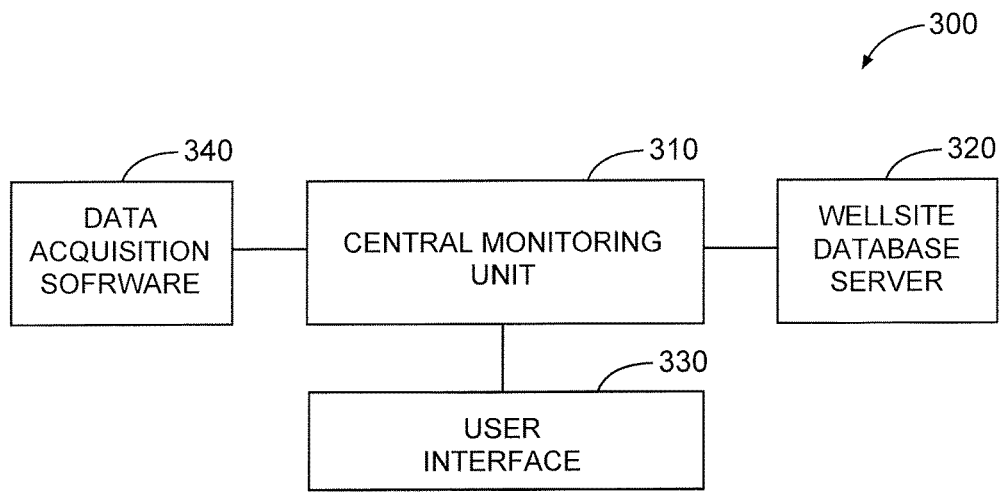
FIG. 3 is a diagram illustrating an example interface within a workflow architecture according to aspects of the present disclosure.

The IHS 106A-106N, 108A-108N, 112A-112N may also implement central monitoring unit 310 such as shown in FIG. 3 of the present embodiment. The central monitoring unit 310 may provide an interface to one or more suitable integrated drive electronics drives, such as a hard disk drive (HDD) or compact disc read only memory (CD ROM) drive, or to suitable universal serial bus (USB) devices through one or more USB ports. In certain embodiments, the central monitoring unit 310 may also provide an interface to a keyboard, a mouse, a CD-ROM drive, and/or one or more suitable devices through one or more firewire ports. A user, operator, or technician at the wellsite may access the central monitoring unit 310 through a user interface 330. For certain embodiments of the invention, the central monitoring unit 310 may also provide a network interface through which central monitoring unit 310 can communicate with other computers and/or devices.

In one embodiment, the central monitoring unit 310 may have access to a wellsite database server 320. In certain embodiments, the connection may be an Ethernet connection via an Ethernet cord. As would be appreciated by those of ordinary skill in the art, with the benefit of this disclosure, central monitoring unit 310 may be connected to the wellsite database server by other suitable connections, such as, for example, wireless, radio, microwave, or satellite communications. Such connections are well known to those of ordinary skill in the art and will therefore not be discussed in detail herein. In one embodiment, the central monitoring unit 310 may record data in such a manner that the central monitoring unit 310 using software can track and monitor all of the issues that may arise at the wellsite. The data will be stored in a database with a common architecture, such as, for example, oracle, SQL, or other type of common architecture.

The reportable issues that may arise at the wellsite are generally known to a person of skill in the art. These and other issue may be associated with a unique identification code at the wellsite database server 320. The unique identification code for each issue may include issues associated with environmental parameters, downhole parameters, formation evaluation parameters, issues with resistivity or conductivity of the drilling mud and earth formations. Many other issues may be known to one skill in the art, and a catalogue can be set up with each of those issues using a unique identification code including the information discussed above. The data acquisition software 340 connected to the central monitoring unit may further be used to collect all of the parameters associated with a reportable issue based on the information presented information identified through the unique identification code.

In one embodiment, the software produces data that may be presented to the operation personnel in a variety of visual display presentations such as a display.

The operations will occur in real-time and the data acquisition from the various central monitoring units 310 need to exist. In one embodiment of data acquisition at a centralized location, the data is pushed at or near real-time enabling real-time communication of the reportable issue and resolving and reporting capability. This reduces the non-productive time at the wellsite that may have been associated with manual reporting of issues and search for solutions and contact information for technical support team to resolve the issue.

In accordance with an exemplary embodiment of the present invention, once a catalogue of issues associated with unique identification codes has been set up, they may be used to automate and optimize the process of reporting, monitoring, and resolving issues at the wellsite. For example, if there is an issue generated at an IHS 106A, information may be gathered by the central monitoring unit, and the issue may trigger a unique identification code and action plan. The information associated with the unique identification code for the issue may provide for collecting the relevant diagnostic information, uploading it to a network accessible location, and sharing that information with a technical support team available at the realtime operations center 240. Simultaneously, the software may alert a specialist in connection with the issue should the information associated with the unique identification code for the issue requires a specialist in interpreting and resolving the issue. In this manner, as would be appreciated by those of ordinary skill in the art, with the benefit of this disclosure, the central monitoring unit 310 may also collect data from multiple locations and feed that information through the network to the regional database server 210 for correlation and analysis. Such data may further be correlated across wellsites, platforms, and even countries all over the world for constant reporting, monitoring, and updating. Such information may provide correlations between issues at multiple wellsites, and generate an improved manner of reporting and resolving an issue.

Further, there may be multiple Realtime Operations Centers 240 available that could further connect to various technology centers that have subject matter experts or technical experts. These subject matter experts or the technicians at the Realtime Operations Center 240 can update the triggered issue by appending additional information or knowledge regarding the issue. The Regional Database Server 210 is not intended to be limited to a particular Region, such as North America. Rather, the designation Regional Database Server 210 is intended to identify accessibility from multiple locations, such as locations for conducting reservoir operations, realtime operations centers 240, and technology centers. The present invention may further include a central issue advisor server which may additionally be accessible by the various locations for conducting reservoir operations, realtime operations centers 240, and technology centers. The central issue advisor server may further perform additional analysis to identify commonalities or patters into issues that arise at one or more rig locations. It could also allow for generation of reports or notices to contacts or functional boxes with different statuses such as "New," "Pending Review," or "Completed." This and other may be accomplished based on the disclosure of the present invention.

As would be appreciated by those of ordinary skill in the art, with the benefit of this disclosure, the central monitoring unit 310 may be implemented on virtually any type of information handling system regardless of the platform being used. Moreover, one or more elements of the information handling system may be located at a remote location and connected to the other elements over a network. In a further embodiment, the information handling system may be implemented on a distributed system having a plurality of nodes. Such distributed computing systems are well known to those of ordinary skill in the art and will therefore not be discussed in detail herein.

Figure 4:
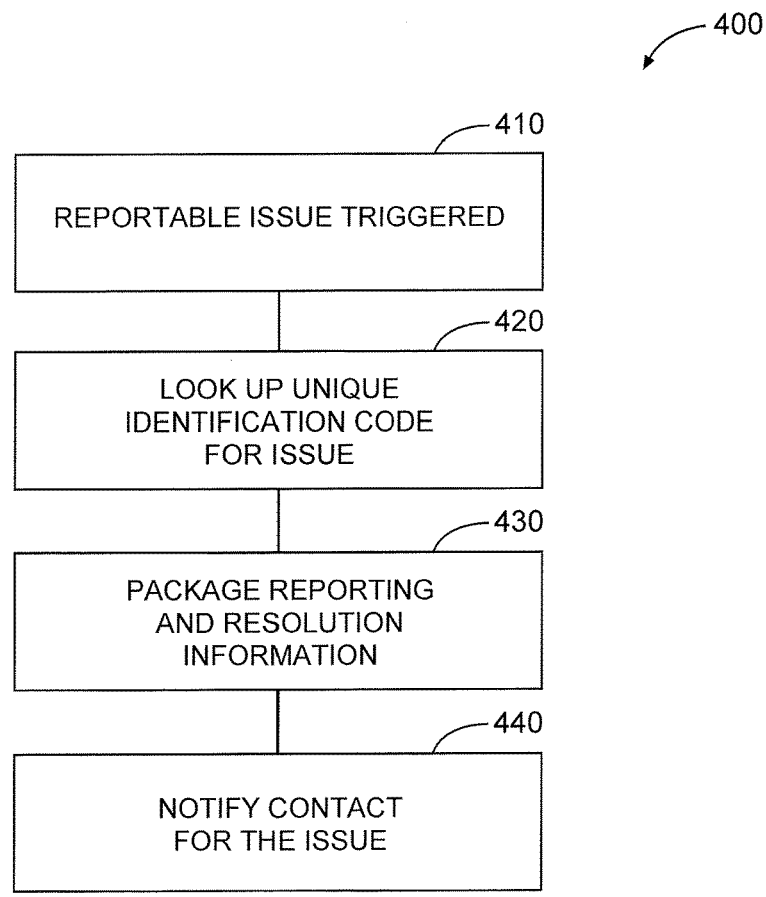
FIG. 4 shows a flow chart illustrating the exemplary process for implementing an embodiment of the present invention.

FIG. 4 is a flowchart 400 illustrating an embodiment of the present invention. At 410, a reportable issue is triggered at the wellsite 100. The reportable issue triggered 410 may arise from any one of the sensors, monitoring equipment, fault generating equipment, or any other means known to one of skill in the art. Once the reportable issue is triggered, the software performs an analysis to determine the unique identification code for the reportable issue 420. Such a unique identification code can be associated with a record in a database, and the central monitoring unit 310 may have access to the database. The unique identification code may further be associated with troubleshooting data, notification data, reporting data, contact data, and any other relevant information needed to report or resolve the issue. The records associated with the unique identification codes may be stored in the database. After the lookup of the unique identification code for issue 420, the software can package the reporting and resolution information 430. A catalogue can be set up with the reporting and resolution information and associated with the unique identification code for the reportable issue. At step 440, the software can use the reporting and resolution information to notify the contact for the issue 440 automatically. The software thus automates the process for reporting and contact of issues and can include the necessary information for reporting and resolution of the issues.

In certain embodiments, the reporting and resolution of the issues may be partially automated. For example, the central monitoring unit 310 may receive an alert regarding an issue that may require manual intervention by the on-site technician. Additionally, the central monitoring unit 310 may receive further instructions from the software at the user interface 330 for resolution steps to the issue.

Therefore, the present invention is well adapted to attain the ends and advantages mentioned as well as those that are inherent therein. The particular embodiments disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered or modified and all such variations are considered within the scope and spirit of the present invention. Also, the terms in the claims have their plain, ordinary meaning unless otherwise explicitly and clearly defined by the patentee. The indefinite articles "a" or "an," as used in the claims, are each defined herein to mean one or more than one of the element that it introduces.

A number of examples have been described. Nevertheless, it will be understood that various modifications can be made. Accordingly, other implementations are within the scope of the following claims.

What is claimed is:

1. A method for reporting issues for rig operations, comprising:
   providing a plurality of monitoring units, wherein the monitoring units are communicatively coupled to a wellsite database server;
   receiving a reportable issue associated with a wellsite at the at least one monitoring unit, wherein the reportable issue is associated with an identification code, wherein the identification code is associated with a record of information associated with the reportable issue, wherein the record of information provides reporting information, and wherein the identification code includes one or more issues associated with at least one of an environmental parameter, a downhole parameter, a formation evaluation parameter, a resistivity parameter, and a conductivity parameter;
   setting up a catalogue of the reportable issue based on the identification code;
   uploading debugging information to a network storage location based on the catalogue;
   creating an access link for the debugging information based on information in the catalogue associated with the identification code;
   automatically communicating, based on the record of information associated with the reportable issue, the reportable issue to a remote information handling system; and
   sending a notification with the access link to a specialist of the reportable issue.

2. The method of claim 1, further wherein the identification code is a unique identification code for the reportable issue.

3. The method of claim 1, further wherein the wellsite database server maintains the plurality of the record of information associated with the reportable issue.

4. The method of claim 1, wherein the record of information further includes information for resolving the issue.

5. The method of claim 1, further wherein the monitoring unit receives troubleshooting steps associated with the reportable issue.

6. The method of claim 1, further wherein the reportable issue is sent to a realtime operations center.

7. The method of claim 6, further wherein the realtime operations center receives the information through a network.

8. A non-transitory computer-readable medium storing instructions that, when executed by data processing apparatus, perform operations comprising:
providing a plurality of monitoring units, wherein the monitoring units are communicatively coupled to a wellsite database server;
receiving a reportable issue associated with a wellsite at the at least one monitoring unit, wherein the reportable issue is associated with an identification code, wherein the identification code is associated with a record of information associated with the reportable issue, wherein the record of information provides reporting information, and wherein the identification code includes one or more issues associated with at least one of an environmental parameter, a downhole parameter, a formation evaluation parameter, a resistivity parameter, and a conductivity parameter;
setting up a catalogue of the reportable issue based on the identification code;
uploading debugging information to a network storage location based on the catalogue;
creating an access link for the debugging information based on information in the catalogue associated with the identification code;
automatically communicating, based on the record of information associated with the reportable issue, the reportable issue to a remote information handling system; and
sending a notification with the access link to a specialist of the reportable issue.

9. The computer-readable medium of claim 8, further wherein the identification code is a unique identification code for the reportable issue.

10. The computer-readable medium of claim 8, further wherein the wellsite database server maintains the plurality of the record of information associated with the reportable issue.

11. The computer-readable medium of claim 8, wherein the record of information further includes information for resolving the issue.

12. The computer-readable medium of claim 8, further wherein the monitoring unit receives troubleshooting steps associated with the reportable issue.

13. The computer-readable medium of claim 8, further wherein the reportable issue is sent to a realtime operations center.

14. The computer-readable medium of claim 8, further wherein the realtime operations center receives the information through a network.

15. A computing system comprising:
a communications interface communicatively coupled to a wellsite database server, wherein the communications interface is operable to receive a reportable issue associated with a wellsite at the at least one monitoring unit, wherein the reportable issue is associated with an identification code, wherein the identification code is associated with a record of information associated with the reportable issue, wherein the record of information provides reporting information, and wherein the identification code includes one or more issues associated with at least one of an environmental parameter, a downhole parameter, a formation evaluation parameter, a resistivity parameter, and a conductivity parameter; and
a data processing apparatus to set up a catalogue of the reportable issue based on the identification code, upload debugging information to a network storage location based on the catalogue, create an access link for the debugging information based on information in the catalogue associated with the identification code, automatically communicate, based on the record of information associated with the reportable issue, the reportable issue to a remote information handling system and send a notification with the access link to a specialist of the reportable issue.

16. The computing system of claim 15, the data processing apparatus being operable to associate the record information with information for resolving the issue.

17. The computing system of claim 16, wherein the information for resolving the issue may further comprise troubleshooting steps associated with the issue.

18. The computing system of claim 15, the data processing apparatus being operable to associate a unique code to each of the identification codes.

19. The computing system of claim 15, the data processing apparatus being operable to communicate the reportable issues to a realtime operations center.

20. The computing system of claim 15, further wherein the communications interface receives troubleshooting information for the issue.

* * * * *